United States Patent [19]
Zimmerman

[11] Patent Number: 5,760,714
[45] Date of Patent: Jun. 2, 1998

[54] INTERRUPT-DRIVEN KEYPAD SCANNING METHOD AND APPARATUS

[75] Inventor: Daniel F. Zimmerman, Chicago, Ill.

[73] Assignee: Motorola, Inc., Schaumburg, Ill.

[21] Appl. No.: 753,075

[22] Filed: Nov. 20, 1996

[51] Int. Cl.$^6$ .................................................. H03M 11/00
[52] U.S. Cl. ........................... 341/26; 341/22; 340/825.79
[58] Field of Search ...................... 341/26, 22; 400/47.2; 364/709.01; 340/825.79, 825.87

[56] References Cited

U.S. PATENT DOCUMENTS

| | | | |
|---|---|---|---|
| 4,591,833 | 5/1986 | Ishii | 341/26 |
| 4,617,554 | 10/1986 | Krause | 341/26 |
| 5,070,330 | 12/1991 | Wu | 341/26 |
| 5,280,283 | 1/1994 | Raasch | 341/26 |
| 5,450,080 | 9/1995 | Irwin | 341/26 |
| 5,486,824 | 1/1996 | Kiwerk | 341/76 |
| 5,512,893 | 4/1996 | Gulick | 341/26 |

*Primary Examiner*—Michael Horabik
*Assistant Examiner*—Albert K. Wong
*Attorney, Agent, or Firm*—Sylvia Chen

[57] ABSTRACT

The interrupt-driven keypad scanning method and apparatus accurately interprets keypresses in single-keypress applications. Initially, interrupts (16, 26, 36, 46) associated with each column line (10, 20, 30, 40) of a keypad matrix (70) are set to trigger when a key is pressed. Once an interrupt triggers, a microcontroller (99) polls the row lines (15, 25, 35, 45, 55, 65) to determine which key, if any, was validly pressed. If exactly one keypress is detected, the keypress is valid. Next, the interrupt for the valid key's column line is enabled while the other column line interrupts are disabled. When a next interrupt is received, the keypad returns to the row-scan state for determination of which keys are depressed. If no keys are depressed, which occurs when the validly-pressed key has been released, the keypad returns to the keypress-detect state. The method also interprets pathological keypresses such as key rollover, multiple keypresses, and key mis-hits.

14 Claims, 7 Drawing Sheets

INTERRUPT-DRIVEN KEYPAD SCANNING METHOD AND APPARATUS

FIELD OF THE INVENTION

This invention relates generally to keypad interfaces for electronic devices, and more particularly to a method and apparatus for keypad scanning.

BACKGROUND OF THE INVENTION

One keypad scanning technique uses a dedicated microprocessor to periodically poll (typically every 20–30 milliseconds) the state of a keypad matrix to determine when a key is pressed or released. Periodic polling, however, results in excess keypad strobe noise, because the keypad matrix contains useful information for only a fraction of the times that it is polled.

Polling less frequently, however, would result in the missing of keypresses and keyreleases, which would be undesirable.

Another keypad scanning technique uses interrupts to a microcontroller to indicate whenever a keypad changes state. Not every change of keypad state, however, provides useful information to a microcontroller. For example, in certain applications, only a single keypress can be valid at a time. Thus once a valid single keypress is detected, all other keypad state changes except for the release of that valid key may be ignored. Conventional interrupt-based scanning, however, does not exploit this fact. Single-keypress applications include dialing a phone number using a telephone keypad, entering numbers into a calculator, and selecting functions using a television/VCR/cable remote controller.

Additionally, conventional interrupt-based scanning schemes generally misinterpret pathological keypresses such as: a) multiple keypresses, when two or more keys are pressed simultaneously; b) key rollover, when a second key is pressed and then the first key is released; and c) key mis-hit, when a first key is pressed and held while a second key is pressed and released. In a single-keypress application, superfluous keypad strobing created by conventional interrupt-based scanning techniques causes a higher system real time applications activity and current drain than necessary. Also, conventional keypad scanning techniques usually require circuitry in addition to a microcontroller, which results in a larger product size, higher cost, and increased software complexity.

There is a need for a keypad scanning method and apparatus that properly interprets pathological keypress situations and also has a diminished keypad strobe noise, lower cost, and reduced complexity compared to existing scanning techniques.

DETAILED DESCRIPTION OF THE PREFERRED EMBODIMENT

The interrupt-driven keypad scanning method and apparatus uses a minimal number of interrupts to detect a valid single keypress in a keypad matrix and properly respond to pathological keypresses. In the keypress-detect state, interrupts associated with each column line of the keypad matrix are enabled. A keypress then triggers an interrupt. Once an interrupt is detected by a microcontroller, the keypad enters a row-scan state where all the rows of the keypad matrix are polled sequentially to determine precisely which keys, if any, were pressed. If exactly one keypress is detected, the keypress is designated valid, and the keypad enters a keyrelease-detect state. During the keyrelease-detect state, the interrupt for the valid key's column is enabled while all the other column interrupts are disabled. Thus, only the release of the validly pressed key will cause an interrupt to the microcontroller, which enables the keypad to ignore key mis-hits. When an interrupt is received during the keyrelease-detect state, the keypad returns to the row-scan state for determination of which keys are depressed. If no keys are depressed, which occurs when the originally-pressed key is released, the keypad returns to the keypress-detect state.

If, however, the row-scan state determines that a single key remains depressed, such as in a key rollover situation, that next key is designated valid and the keypad enters the keyrelease-detect state. Thus during key rollover, which sometimes occurs when dialing with more than one finger, both single, yet partially overlapping in time, keypresses are interpreted as valid.

Whenever multiple keys are detected as pressed during the row-scan state, the keypad is set to trigger an interrupt whenever a key is released. Then the keypad is set to the keyrelease-detect state. If an interrupt is received during the keyrelease-detect state, the keypad returns to the row-scan state for a determination that any remaining single keypress is valid. Thus, when multiple keys are pressed simultaneously, which sometimes occurs when key spacing is small compared to the size of a user's fingers, the keypad assumes that the last-released key was the valid keypress.

Figure 1:
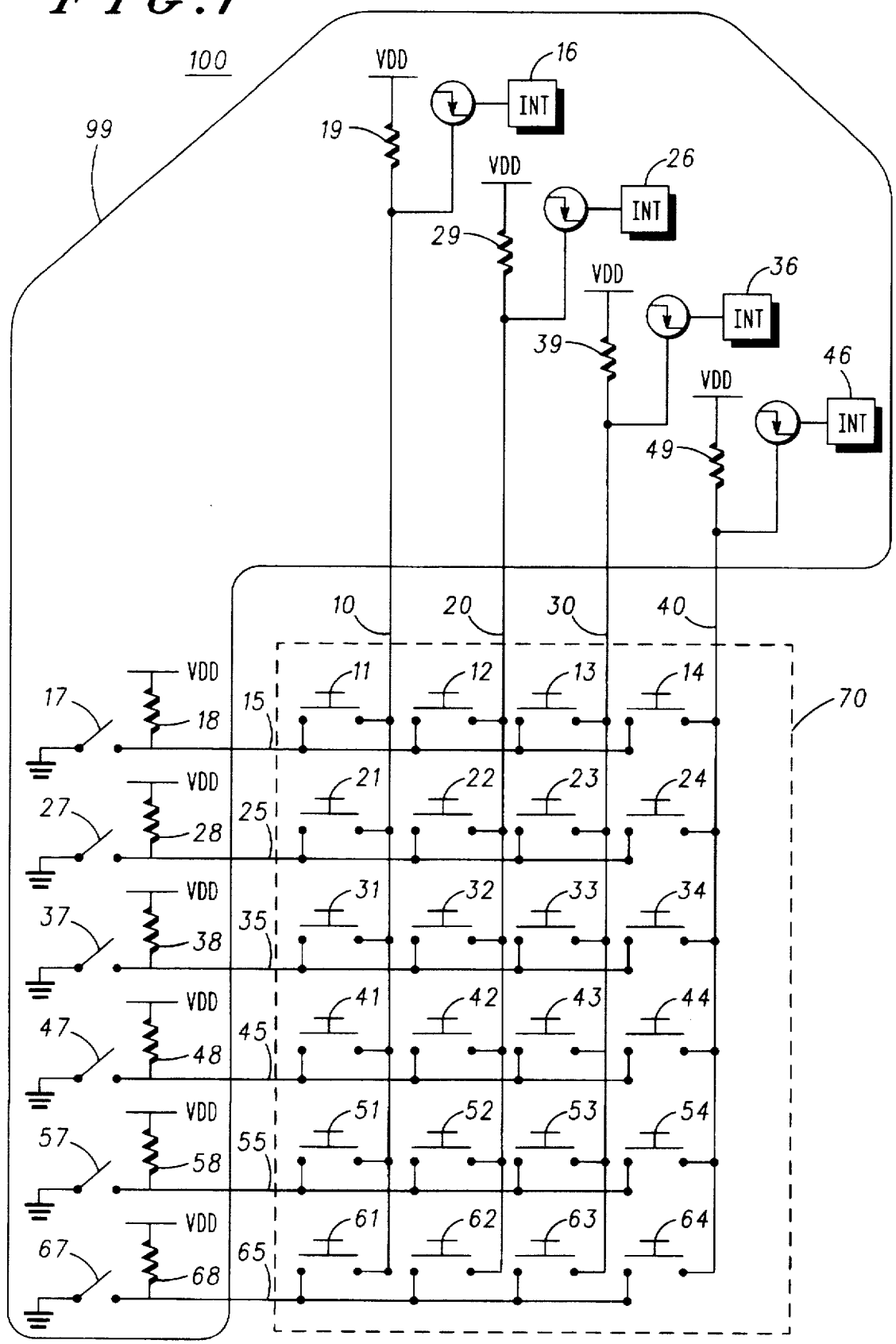
FIG. 1 shows a schematic of a keypad according to a preferred embodiment.

FIG. 1 shows a schematic of a keypad according to a preferred embodiment. A keypad matrix 70 of an electronic device 100 has, for example, six rows of four keys 11–14, 21–24, 31–34, 41–44, 51–54, 61–64. In this example, the electronic device 100 is a cellular telephone handset, however, other electronic devices with keypads such as remote controllers, cordless telephones, and electronic calculators may use the interrupt-driven keypad scanning method and apparatus. A microcontroller 99, such as a Motorola HC12 microcontroller, is attached to the row lines and the column lines of the keypad matrix 70.

Using the microcontroller 99, the row lines 15, 25, 35, 45, 55, 65 of the keypad matrix 70 can be set to one of two states: an output state latching a logic 0 (low signal level); or a high impedance input state when pull-up resistors 18, 28, 38, 48, 58, 68 are enabled. Preferably, the pull-up resistors are software-enabled and are controlled by the microcontroller 99. Of course, other row line states may be implemented, such as an output state latching a logic 1 (high signal level) to the keypad matrix and a high impedance input state with pull-down resistors. The state of each row line is determined by switches 17, 27, 37, 47, 57, 67 which are independently controlled by the microcontroller 99. Each column line 10, 20, 30, 40 can be used in any of three states as determined by software control to interrupt masks 16, 26, 36, 46: falling edge triggered interrupt; rising edge triggered interrupt; and disabled interrupt. In each of the three column line states, pull-up resistors 19, 29, 39, 49 are connected to the column lines 10, 20, 30, 40 and the column lines are selected as high-impedance inputs.

Figure 2:
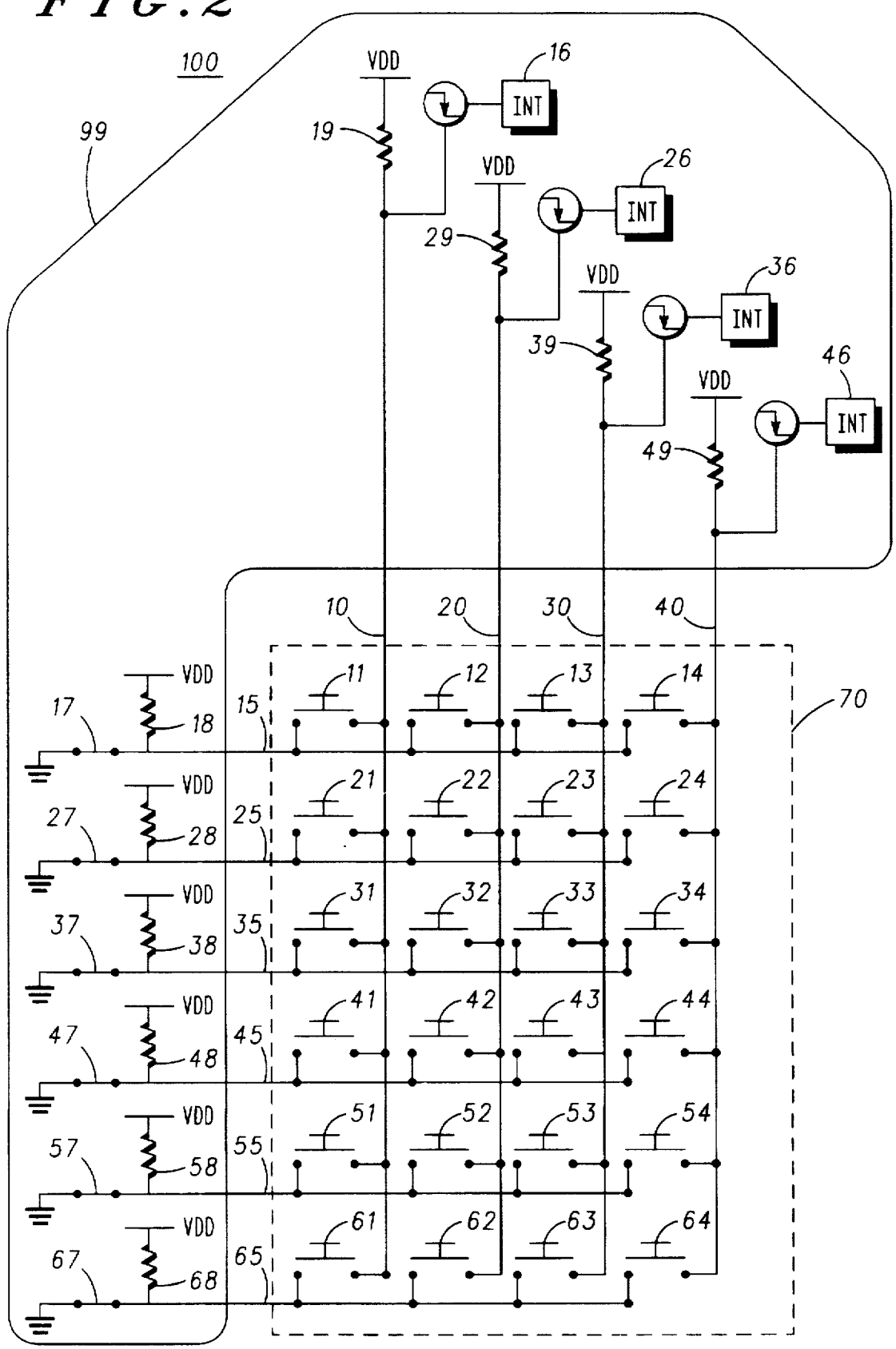
FIG. 2 shows a schematic of the keypad in a keypress-detect state according to the preferred embodiment.

FIG. 2 shows a schematic of the keypad in a keypress-detect state according to the preferred embodiment. In the keypress-detect state, all of the row lines 15, 25, 35, 45, 55, 65 of the keypad matrix 70 are set to the output state and are latched to a logic 0 by closing switches 17, 27, 37, 47, 57, 67. All of the column lines 10, 20, 30, 40 have their associated interrupt masks 16, 26, 36, 46 enabled and set to trigger on a falling edge. Thus, if any key is depressed, the keypress will trigger a falling edge interrupt on the column line associated with the pressed key. Once an interrupt is received by the microcontroller 99, the microcontroller instructs the keypad to enter a row-scan state to determine precisely which key, if any, was validly pressed.

Figure 3:
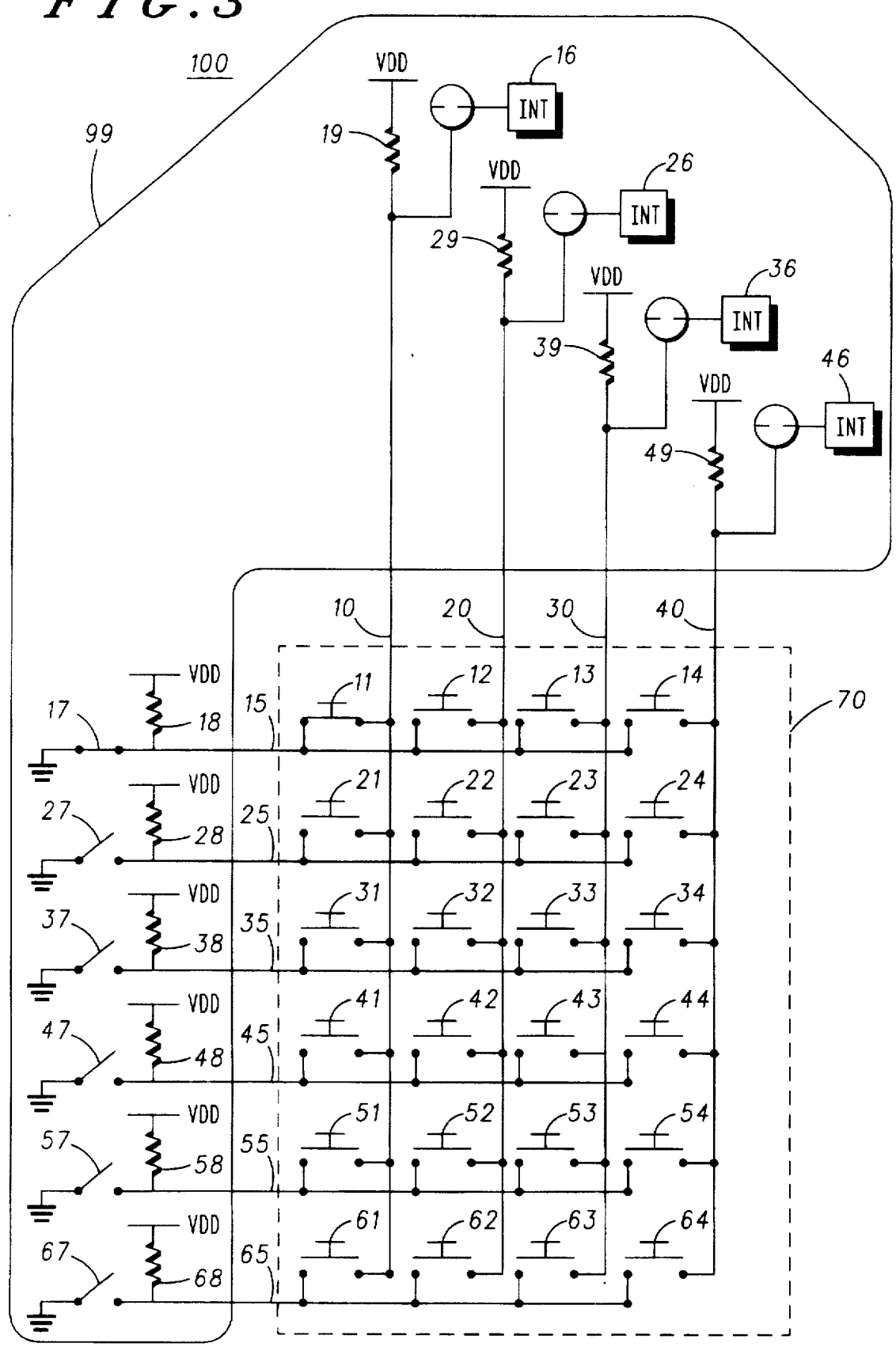
FIG. 3 shows a schematic of the keypad in a row-scan state according to the preferred embodiment.

FIG. 3 shows a schematic of the keypad in a row-scan state according to the preferred embodiment. In the row-scan state, all the column line interrupts 16, 26, 36, 46 are disabled to prevent spurious interrupt masks due to bouncing, keypad scanning, or other keypresses. The microcontroller 99 then sequentially scans all six rows to determine which key, if any, was validly pressed. To scan the first row as shown in FIG. 3, row line 15 is set to an output state latched to a logic 0 by closing switch 17, and all the other row lines 25, 35, 45, 55, 65 are set to a high impedance input state by opening switches 27, 37, 47, 57, 67. The microcontroller 99 then reads all of the column lines 10, 20, 30, 40. Next, the second row is scanned by setting row line 25 to an output state latched to a logic 0 signal by closing switch 27 while the microcontroller 99 opens the other switches 17, 37, 47, 57, 67 to create a high impedance input state for the remaining row lines 15, 35, 45, 55, 65. Again, the microcontroller 99 reads all of the column lines. This procedure is repeated with each row in the keypad matrix 70.

A keypress is detected when a column line reads a logic 0 during the row-scan state. This indicates that the column line that read a logic 0 and the row that contained the closed switch intersect where a depressed key is located. A row that does not contain a depressed key causes all the column lines to read logic 1 when that row's associated switch is closed and all of the other row's switches are open.

The process of scanning all the rows in the keypad matrix is performed at least twice at intervals and as many times as necessary to ensure that the keypad signal has debounced. In this example, key 11 has been depressed and the keypress is detected when column line 10 reads logic 0 and the other column lines 20, 30, 40 read logic 1 when switch 17 is closed and the other switches 27, 37, 47, 57, 67 are open, and all of the column lines 10, 20, 30, 40 read logic 1 at all other times during the keypad scan. If exactly one keypress is detected in this state, that keypress is deemed valid, and the keypad enters the keyrelease-detect state.

Figure 4:
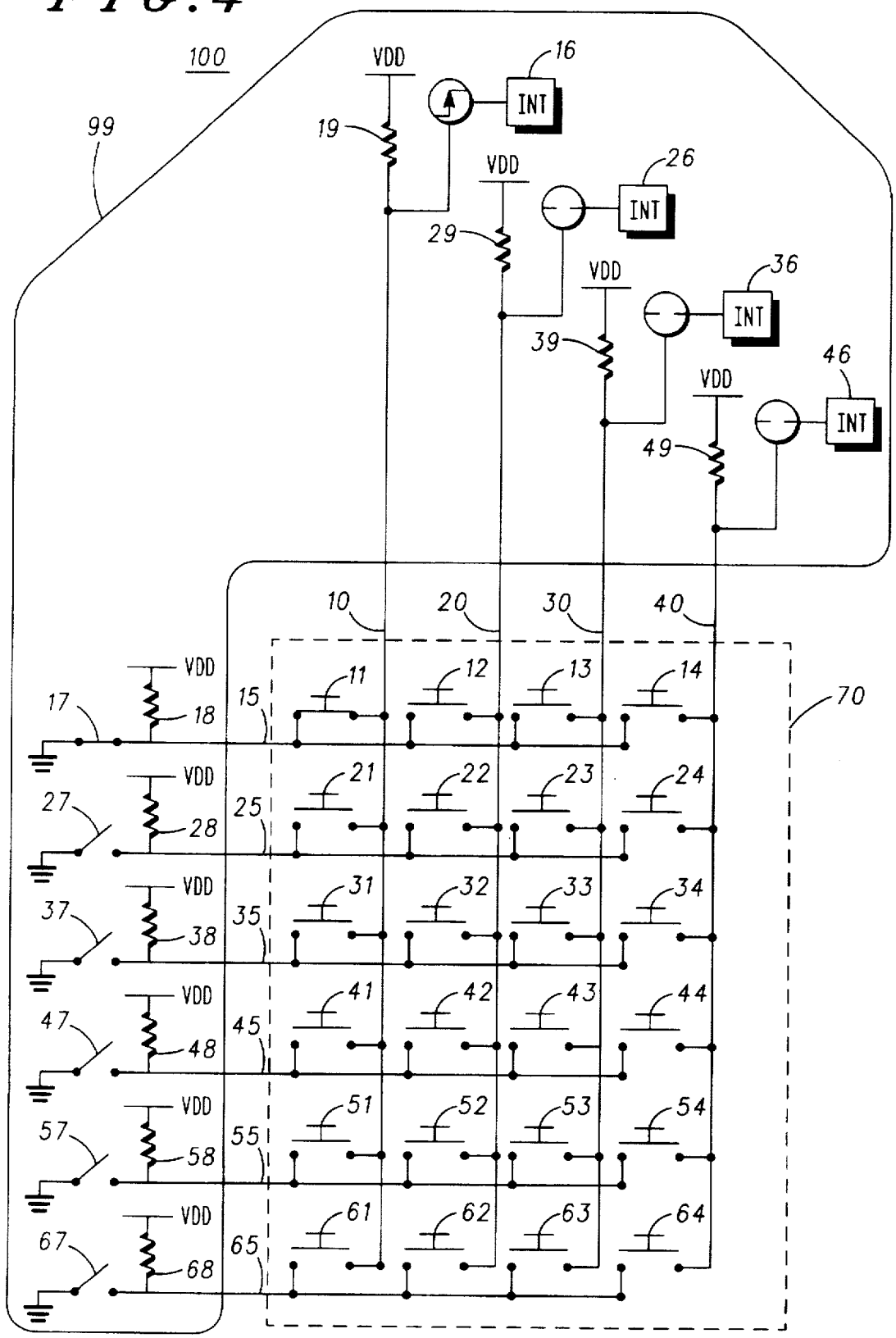
FIG. 4 shows a schematic of the keypad in a keyrelease-detect state according to the preferred embodiment.

FIG. 4 shows a schematic of the keypad in a keyrelease-detect state according to the preferred embodiment. In the keyrelease-detect state, the keypad is configured so that only the release of the previous validly-pressed key 11 will send an interrupt to the microcontroller 99. The row line 15 of the validly-pressed key 11 is set to an output state latching a logic 0. All other row lines 25, 35, 45, 55, 65 are set to a high-impedance input state using switches 27, 37, 47, 57, 67 and software-enabled pull-up resistors 18, 28, 38, 48, 58, 68. The column line interrupt 16 associated with the validly-pressed key 11 is set to trigger on a rising edge transition. All other column line interrupts 26, 36, 46 are disabled.

This configuration ensures that the microcontroller 99 will detect the release of the validly-pressed key 11, and that no other key presses or releases will send interrupts to the microcontroller. This feature is desirable especially in applications that do not process multiple keypresses simultaneously, because in this configuration extraneous keypresses and keyreleases will not interrupt the microcontroller. Note that other interrupt configurations may be used to ensure that only the release of the validly-pressed key will send an interrupt to the microcontroller. For example, the associated column line 10 can have an interrupt mask 16 set to trigger on a falling edge transition with the other column line interrupt masks 26, 36, 46 disabled while the associated row line 15 is set to an output state latching a logic 1 while the other row lines 25, 35, 45, 55, 65 are set to an input state using pull-down resistors.

When a keyrelease generates an interrupt, the microcontroller 99 returns to the row-scan state, and the keypad matrix 70 is scanned and debounced as described in accordance with FIG. 3 to determine which keys, if any, are depressed.

Figure 5:
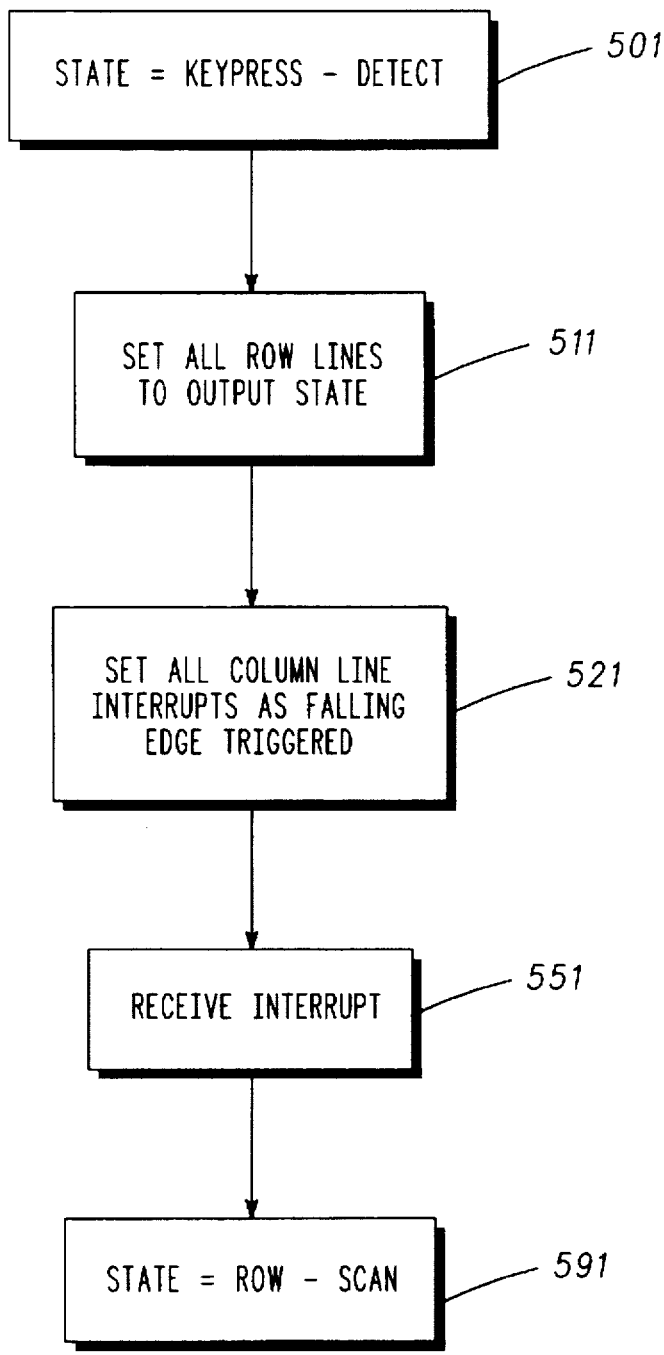
FIG. 5 shows a flowchart of the keypress-detect state according to the preferred embodiment.

FIG. 5 shows a flowchart of the keypress-detect state according to the preferred embodiment. In step 501, the initial state is set to keypress-detect. Step 511 closes all of the switches 17, 27, 37, 47, 57, 67 shown in FIG. 1 to set all of the row lines 15, 25, 35, 45, 55, 65 to output a logic 0. Step 521 enables falling edge triggered interrupts on all column lines 10, 20, 30, 40 of the keypad matrix 70. Then, the microcontroller 99 waits for an interrupt signal. Note that, because the microcontroller does not need to poll the keypad matrix periodically, the microcontroller may be used to monitor or control other, non-keypad-related, functions of the electronic device while it is waiting for an interrupt. Once an interrupt is received in step 551, the state is set to row-scan in step 591.

Figure 6:
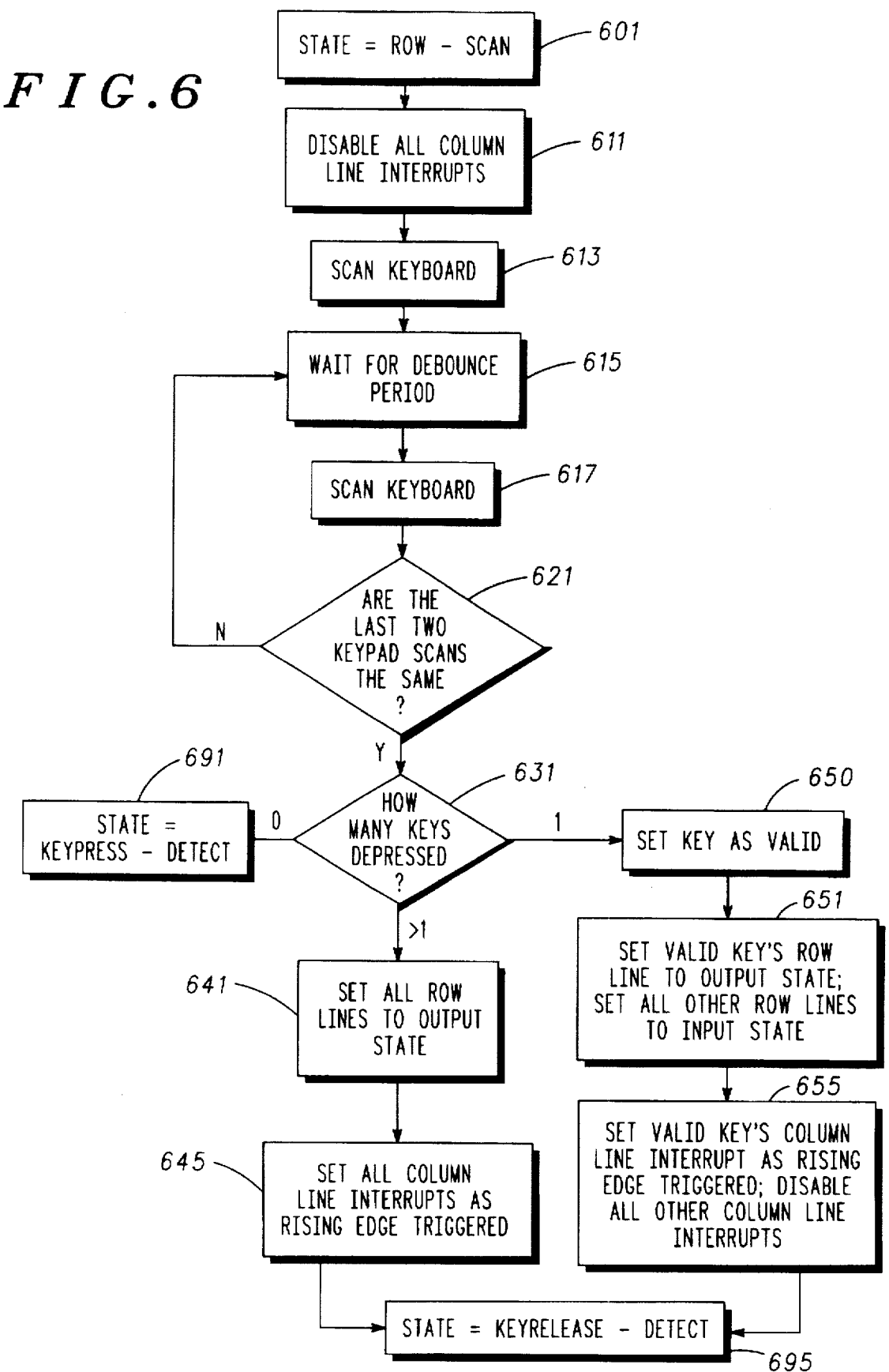
FIG. 6 shows a flowchart of the row-scan state according to the preferred embodiment.

FIG. 6 shows a flowchart of the row-scan state according to the preferred embodiment. Step 601 shows that the microcontroller is in a row-scan state. In the row-scan state, step 611 disables all column line interrupts and step 613 scans the keypad matrix as described in accordance with FIG. 3. Step 615 instructs the microcontroller to wait for a predetermined debounce period such as 20 milliseconds. Once the debounce period is over, step 617 scans the keypad matrix again. In step 621, the microcontroller compares the results of the most recent two keypad scans. If the results of the compared keypad scans are different, the keypad has not finished debouncing, and the microcontroller returns to step 615. Once the keypad has finished debouncing, the results of the most recent two keypad scans will be identical and step 631 determines how many keys were pressed.

If exactly one key was pressed as detected by the keypad scan, step 650 designates the keypress as valid. The valid keypress may then be displayed and/or entered in the microcontroller as data. The row line that contains the valid keypress is set to output a logic 0 and all other row lines are set as high-impedance inputs in step 651. Step 655 enables the interrupt of the column line that contains the detected key as rising edge triggered and disables all other column line interrupts. This configuration ensures that only the release of the detected key will interrupt the microcontroller, which reduces unnecessary interrupts. The state is set to keyrelease-detect in final step 695.

If no keys were pressed as determined by the keypad scan, step 691 sets the state equal to keypress-detect, which operatively resets the keypad. If more than one key was pressed as determined by the keypad scan, step 641 sets all of the row lines 15, 25, 35, 45, 55, 65 shown in FIG. 1 to output a logic 0 and step 645 enables all of the column line interrupts 16, 26, 36, 46 as rising edge triggered. Then, step 695 sets the state equal to keyrelease-detect. This allows any keyrelease to interrupt the microcontroller.

Figure 7:
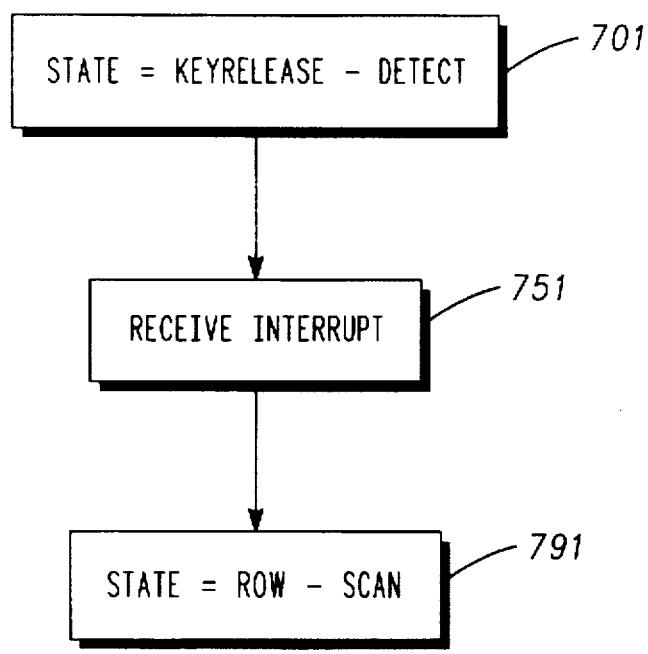
FIG. 7 shows a flowchart of the keyrelease-detect state according to the preferred embodiment.

FIG. 7 shows a flowchart of the keyrelease-detect state according to the preferred embodiment. Step 701 shows that the microcontroller is in a keyrelease-detect state. In this state, the microcontroller merely waits to receive an interrupt as shown in step 751. During this waiting period, the microcontroller may monitor and control other, non-keypad related, functions. After an interrupt is received, step 791 sets the state to row-scan.

Once the microcontroller is interrupted in the keyrelease-detect state, the microcontroller returns to the row-scan state. After the keypad is debounced in the row-scan state, the microcontroller determines if zero, one, or more than one keys were depressed. If zero keys were depressed, which is common when the release of a valid keypress in the keyrelease-detect state triggers a rising edge interrupt, the keypad returns to the keypress-detect state. If one key was depressed, which is common in a key rollover situation where the previous validly-pressed key was released in the keyrelease-detect state but a new key was also pressed, the newly-depressed key is designated valid and the keypad goes to the keyrelease-detect state. Finally, if more than one key was depressed simultaneously, the microcontroller sets the row line and the column lines so that any keyrelease triggers an interrupt and the microcontroller sends the keypad back to the keyrelease-detect state.

Thus, the interrupt-driven keypad scanning method and apparatus reasonably interprets pathological keypresses and also provides reduced keypad strobe noise, lower cost, and reduced complexity scanning compared to conventional periodic polling and the interrupt-based keypad scanning techniques. By minimizing the polling periods and reducing the number of interrupts generated by the keypad, the microcontroller can also be more efficiently used by the electronic device. While specific components and functions of the interrupt-driven keypad scanning method and apparatus are described above, fewer or additional functions could be employed by one skilled in the art within the true spirit and scope of the present invention. The invention should be limited only by the appended claims.

We claim:

1. An interrupt-driven keypad scanner comprising:

a keypad matrix having a row line and a column line;

a switch coupled to the row line for setting the row line to either an input state or an output state;

a first disableable interrupt generator coupled to the column line for detecting a keypress; and a second disableable interrupt generator coupled to the column line for detecting a keyrelease.

2. An interrupt-driven keypad scanner according to claim 1 further comprising:

a microcontroller coupled to the column line for enabling and disabling the first disableable interrupt generator and the second disableable interrupt generator.

3. An interrupt-driven keypad scanner according to claim 1 further comprising:

a microcontroller coupled to the row line for controlling the switch.

4. An interrupt-driven keypad scanner according to claim 1 further comprising:

a third disableable interrupt generator coupled to a second column line of the keypad matrix.

5. An interrupt-driven keypad scanner according to claim 4 further comprising:

a fourth disableable interrupt generator coupled to a third column line of the keypad matrix.

6. A radiotelephone comprising:

a keypad matrix having a row line and a first column line and a second column line;

a switch coupled to the row line for setting the row line to either an input state or an output state;

a first disableable interrupt generator coupled to the first column line for detecting a keypress;

a second disableable interrupt generator coupled to the first column line for detecting a keyrelease;

a third disableable interrupt generator coupled to the second column line; and a microcontroller coupled to the switch, the first disableable interrupt generator, the second disableable interrupt generator, and the third disableable interrupt generator.

7. An interrupt-driven keypad scanning method, for a keypad matrix having at least one row line and at least one column line and more than one key, comprising the steps of:

setting the at least one column line to an input state having a second signal level and setting the at least one row line to an output state having a first signal level; and enabling an interrupt generator to generate a column interrupt to a microcontroller when the at least one column line transitions from the second signal level to the first signal level detecting the column interrupt using the microcontroller;

scanning the at least one row line to determine whether zero, exactly one, or more than one key is depressed;

if more than one key is depressed:

setting the at least one column line to an input state having a second signal level and setting the at least one row line to an output state having a third signal level;

enabling the interrupt generator to generate a next column interrupt to the microcontroller when the at least one column line transitions from the third signal level to the second signal level; and detecting the next column interrupt using the microcontroller.

8. An interrupt-driven keypad scanning method according to claim 7 further comprising the steps of:

if exactly one key is depressed:

designating the exactly one key as valid;

setting a row line corresponding to the exactly one key to an output state having a fourth signal level;

enabling the interrupt generator to generate a further column interrupt to the microcontroller when a column line corresponding to the exactly one key transitions from the fourth signal level to the second signal level; and detecting the further column interrupt using the microcontroller.

9. An interrupt-driven keypad scanning method according to claim 7 further comprising the steps of:

if zero keys are depressed:

setting the at least one column line to an input state having the second signal level and setting the at least one row line to an output state having the first signal level;

enabling the interrupt generator to generate a column interrupt to the microcontroller when the at least one column line transitions from the second signal level to the first signal level; and detecting the column interrupt using the microcontroller.

10. An interrupt-driven keypad scanning method, for a keypad matrix having a first row line, a second row line, a first column line, a second column line and more than one key comprising the steps of:

setting the first column line and the second column line to an input state having a logic one signal level;

setting the first row line and the second row line to an output state having a logic zero signal level;

enabling an interrupt generator to generate a column interrupt to a microcontroller when the first column line transitions from the logic one signal level to the logic zero signal level detecting the column interrupt using the microcontroller;

scanning the first row line and the second row line to determine whether zero, exactly one, or more than one key is depressed;

if more than one key is depressed:

setting the first column line to an input state having a logic one signal level and setting the first row line to an output state having a logic zero signal level;

enabling the interrupt generator to generate a next column interrupt to the microcontroller when the first column line transitions from the logic zero signal level to the logic one signal level; and detecting the next column interrupt using the microcontroller.

11. An interrupt-driven keypad scanning method according to claim 10 further comprising the steps of:

if exactly one key is depressed:

designating the exactly one key as valid;

setting a row line corresponding to the exactly one key to an output state having a logic zero signal level;

enabling the interrupt generator to generate a further column interrupt to the microcontroller when a column line corresponding to the exactly one key transitions from the logic zero signal level to the logic one signal level; and detecting the further column interrupt using the microcontroller.

12. An interrupt-driven keypad scanning method according to claim 11 further comprising the step of:

disabling the interrupt generator from the second column line, after the step of designating the exactly one key as valid.

13. An interrupt-driven keypad scanning method according to claim 10 further comprising the steps of:

if zero keys are depressed:

setting the first column line and the second column line to an input state having the logic one signal level and setting the first row line and the second row line to an output state having the logic zero signal level;

enabling the interrupt generator to generate a column interrupt to the microcontroller when the first column line transitions from the logic one signal level to the logic zero signal level; and detecting the column interrupt using the microcontroller.

14. An interrupt-driven keypad scanning method according to claim 10 further comprising the steps of:

disabling the interrupt generator from the second column line, before the step of setting the first column line to an input state having a logic one signal level and setting the first row line to an output state having a logic zero signal level.

* * * * *